United States Patent

Miyagawa et al.

[11] Patent Number: 5,828,159
[45] Date of Patent: Oct. 27, 1998

[54] RESONATOR DEVICE ADAPTED FOR SUPPRESSION OF FLUCTUATION IN RESONANT RESISTANCE, AND METHOD OF PRODUCING SAME

[75] Inventors: Takashi Miyagawa; Masanori Yachi, both of Kawasaki, Japan

[73] Assignee: Fujitsu Limited, Kawasaki, Japan

[21] Appl. No.: 869,222

[22] Filed: Jun. 4, 1997

Related U.S. Application Data

[63] Continuation of Ser. No. 440,654, May 15, 1995, abandoned.

[30] Foreign Application Priority Data

Jun. 17, 1994 [JP] Japan .................................. 6-135788

[51] Int. Cl.⁶ .................................................. H01L 41/08
[52] U.S. Cl. ........................... 310/340; 310/344; 310/348; 310/364; 310/312
[58] Field of Search ................................ 310/311, 312, 310/320, 340, 344, 348, 364

[56] References Cited

U.S. PATENT DOCUMENTS

| | | | |
|---|---|---|---|
| 2,439,466 | 4/1948 | Gravley | 310/340 |
| 2,486,968 | 11/1949 | Moulton | 310/340 X |
| 2,759,241 | 8/1956 | Sturm | 310/340 X |
| 4,270,105 | 5/1981 | Parker et al. | 310/340 X |
| 4,450,374 | 5/1984 | Cho et al. | 310/340 X |
| 5,382,929 | 1/1995 | Inao et al. | 310/344 X |
| 5,430,345 | 7/1995 | Takahashi | 310/348 |
| 5,502,344 | 3/1996 | Yoshimoto et al. | 310/344 |

FOREIGN PATENT DOCUMENTS

| | | | |
|---|---|---|---|
| 1027735 | 4/1958 | Germany | 310/340 |
| 0064179 | 4/1986 | Japan | 310/340 |

*Primary Examiner*—Mark O. Budd
*Attorney, Agent, or Firm*—Armstrong, Westerman, Hattori, McLeland & Naughton

[57] ABSTRACT

A resonator device having an insulating substrate, a strip-shaped vibrating element which is mounted on said insulating substrate and is provided with driving electrodes formed on the main opposing surfaces of a piezoelectric substrate, and terminal electrodes which are provided on said insulating substrate so as to be electrically connected with said driving electrodes and to which driving signals are applied by an external signal source. At least the longitudinal side portions of said vibrating element are coated with a surface active agent. With such a constitution, fluctuations in resonant resistance which are due to the excitation level can be suppressed, thereby contributing to the stable operation of the device, reducing the number of producing steps, and raising the yield rate in production.

5 Claims, 5 Drawing Sheets

RESONATOR DEVICE ADAPTED FOR SUPPRESSION OF FLUCTUATION IN RESONANT RESISTANCE, AND METHOD OF PRODUCING SAME

This application is a continuation of U.S. application Ser. No. 08/440,654 filed May 15, 1995, now abandoned.

BACKGROUND OF THE INVENTION

1. Field of the Invention

The present invention relates to a resonator device, and more particularly, in a piezoelectric device provided with a vibrating element made of a piezoelectric material, the invention relates to a technology for suppressing fluctuations in resonant resistance depending on a driving signal level (hereinafter referred to as an excitation level) for exciting said device.

In comparison with the prior art resonant circuit, which consists of a combination of an inductance element, a capacitance element and so forth, the piezoelectric device can have a compact form and can operate with a smaller loss and with a stable temperature characteristic, so that it is suitably utilized in the field of audio and video apparatus, TV sets, radio sets etc. as well as in a variety of electrical and electronic information and communication apparatus. Especially, the piezoelectric device is suitably used in an oscillator circuit, a band-pass filter etc., so that it is required to cover a wide dynamic range. In order to comply with this requirement, therefore, it must suppress fluctuations in the resonant resistance which cause oscillation failures, fluctuations in oscillation frequency and so forth, especially at a low operating voltage.

2. Description of the Related Art

A vibrating element as used in a piezoelectric device is formed by using a piezoelectric material such as lithium niobate ($LiNbO_3$) or lithium tantalate ($LiTaO_3$), and shows a resonant characteristic which is defined by its geometry. It is known well that such a resonant characteristic (i.e. resonant resistance value) very much depends on the excitation level for exciting the device.

FIG. 1a and FIG. 1b show graphically, the characteristics of fluctuation in loss level vs variation of excitation level for the piezoelectric device.

FIG. 1a shows fluctuation in resonator resistance (displayed in the form of loss level [dB]) when the excitation level is varied as indicated with circled numerals ①, ②, and ③ while FIG. 1b shows fluctuation in loss level when the excitation level is varied in an "acceptable" device, having no micro-cracks, which will be described later. In the figure, ΔRs represents a fluctuation (maximum) in loss level. The less it is, the more preferable. It can be seen from the examples shown in these figures that the device with the characteristic shown in FIG. 1b shows a smaller fluctuation ΔRs in loss level than the device with the characteristics shown in FIG. 1a.

As one of causes of such fluctuations in loss level, micro-cracks, which occur on the edge portions of the vibrating element as typically shown in FIG. 2, could be considered. In this figure, a reference numeral 21 designates a vibrating element, 22 a piezoelectric substrate, 23a (23a') and 23b (23b') a pair of driving electrodes, and 30 a micro-crack.

Such micro-cracks mainly occur during cutting in the production of the piezoelectric device (namely, in the course of cutting a wafer (piezoelectric substrate) having, on its main opposing surfaces, driving electrodes as formed in advance, thereby dividing the wafer into individual vibrating elements as a piezoelectric device). If, as shown in FIG. 2, the micro-cracks 30 occur on edge portions of the vibrating element 21, spurious modulation takes place and the concerned vibrating element shows characteristics like those which would occur if characteristics of severed vibrating elements were superimposed. Consequently, the resonator resistance i.e. loss level varies depending on a change in the excitation level.

Accordingly, the device in which fluctuations in loss level are within a predetermined allowable range, for example the device shown in FIG. 1b, may be shipped as a "acceptable" device, but the device of which the fluctuations (ΔRs) is large as shown in FIG. 1a, has to be rejected.

Heretofore, selection of the device, to determine whether to accept or reject the device, has been made by carrying out a test after the fabrication of the vibrating element. Such test is performed, for example, by the steps of varying the excitation level of the device at arbitrary intervals within a predetermined range, measuring the resonator resistance i.e. loss level at every excitation level, and evaluating the difference between maximum and minimum values of all the values measured (namely, maximum fluctuation quantity ΔRs as shown in FIGS. 1a and 1b).

In the prior art test method as described above, since the fluctuations in loss level of the piezoelectric device are evaluated by varying the excitation level of the device, it is possible to carry out the selection of the acceptable/rejected device, but this test method involves a problem in that the number of production steps is increased.

Also, a problem occurs in that a large fluctuation in the resonant resistance, i.e., loss level, depending on a variation in the excitation level of the device is caused by micro-crack generation as shown in FIG. 2, thereby causing oscillation failure, change of oscillation frequency and so forth occurring especially in the operation of the device at a low operating voltage. This is apparently undesirable from a stable operation viewpoint.

Further, in case of defining a test standard, since it is not possible to definitely specify the fluctuation quantity which causes oscillation failure, oscillation frequency change and so forth, there is caused inconvenience in that a test standard is made unnecessarily severe, for instance in that a device with fluctuation quantity ΔRs in its loss level of more than 1 dBm must be rejected. This undesirably results in a decrease in the yield rate of the piezoelectric devices.

SUMMARY OF THE INVENTION

Accordingly, an object of the present invention is to provide a resonator device and a method of producing the same, which can not only suppress fluctuations in the resonant resistance due to the excitation level of the device, but can the stabilize the device operation, decrease of the number of steps for producing the device, and increase the yield rate in producing the same.

The present invention provides, in a first aspect thereof, a resonator device comprising an insulating substrate, a strip-shaped vibrating element which is mounted on said insulating substrate and is provided with driving electrodes formed on the main opposing surfaces of a piezoelectric substrate, and terminal electrodes which are provided on said insulating substrate so as to be electrically connected with said driving electrodes and to which driving signals are applied by an external signal source, wherein at least longitudinal side portions of said vibrating element are coated with a surface active agent or surfactant.

The present invention also provides, in a second aspect thereof, a method of producing a resonator device comprising a first step of dividing a piezoelectric substrate having driving electrodes formed in advance on its main opposing surfaces, into individual vibrating elements as a resonator device through cutting processing, a second step of forming terminal electrodes to be impressed with driving signals on an insulating substrate and then, mounting said vibrating element on said insulating substrate in such a way that said driving electrodes are electrically connected with said terminal electrodes, and a third step of sealing said vibrating element mounted on said insulating substrate by placing a protective cap thereon, wherein a surface active agent or surfactant is applied to at least said vibrating element after performing any one of said first to third steps or while said one step is being carried out.

In a resonator device as constituted according to the present invention, since a film made of a surface active agent or surfactant is formed to cover at least longitudinal side portions of the vibrating element, it is possible to mechanically suppress the undesirable vibration which is caused by micro-cracks generated at edge portions, for instance those as shown in FIG. 2.

Accordingly, with this constitution, fluctuations in resonant resistance (loss level) due to the excitation level can be effectively suppressed. This contributes to the prevention of an occurrence of oscillation failure, oscillation frequency change and so forth, especially in the operation of the device at a low voltage.

However, regarding the selection of a surface active agent or surfactant, it should be noted that there is a possibility that a deterioration in resonator resistance, oscillation frequency change and so forth might occur, as the case may be, according to the quality and quantity of the film (surface active agent or surfactant) formed on the device. Thus, the insulating resistance, molecular weight, and coating quantity (i.e. film thickness) of the surface active agent or surfactant must be pertinently selected.

BRIEF DESCRIPTION OF THE DRAWINGS

Other objects and features of the present invention will be described hereinafter, in detail, by way of preferred embodiments with reference to the accompanying drawings, in which.

DESCRIPTION OF THE PREFERRED EMBODIMENTS

Figure 1A:
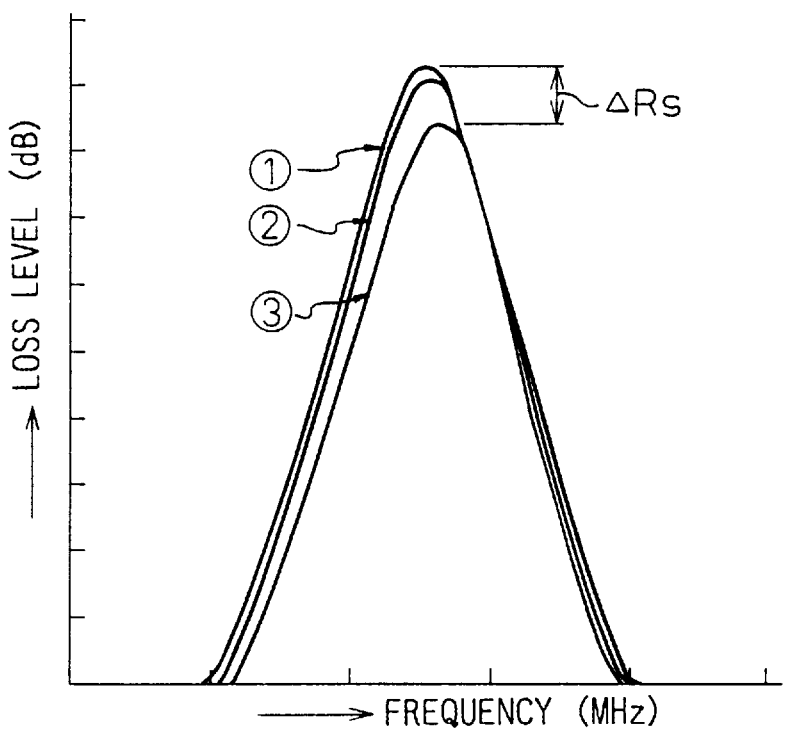
FIG. 1a and FIG. 1b are graphical presentations showing the characteristics of fluctuations in loss level vs. variation of excitation level for a piezoelectric device.
Figure 1B:
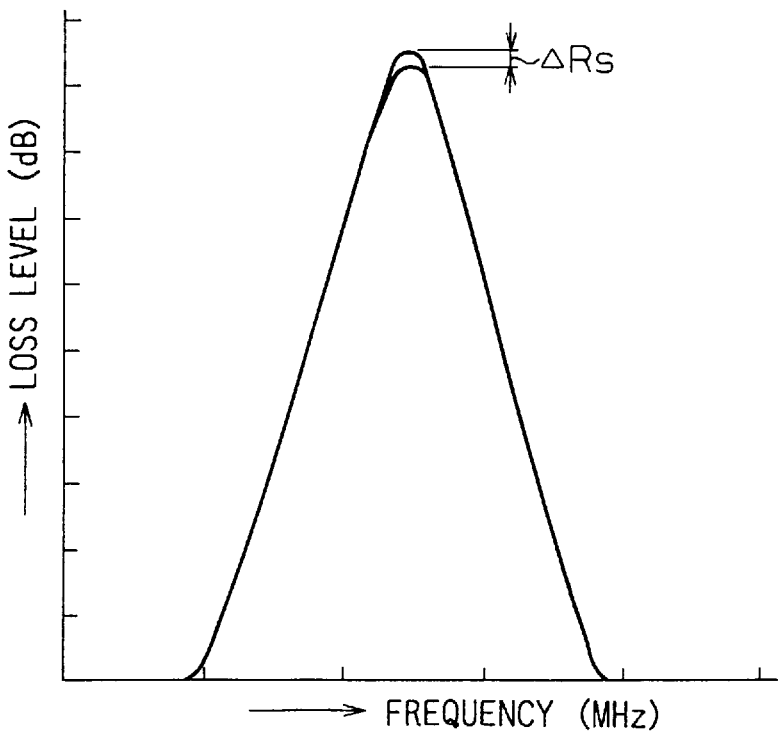
Figure 2:
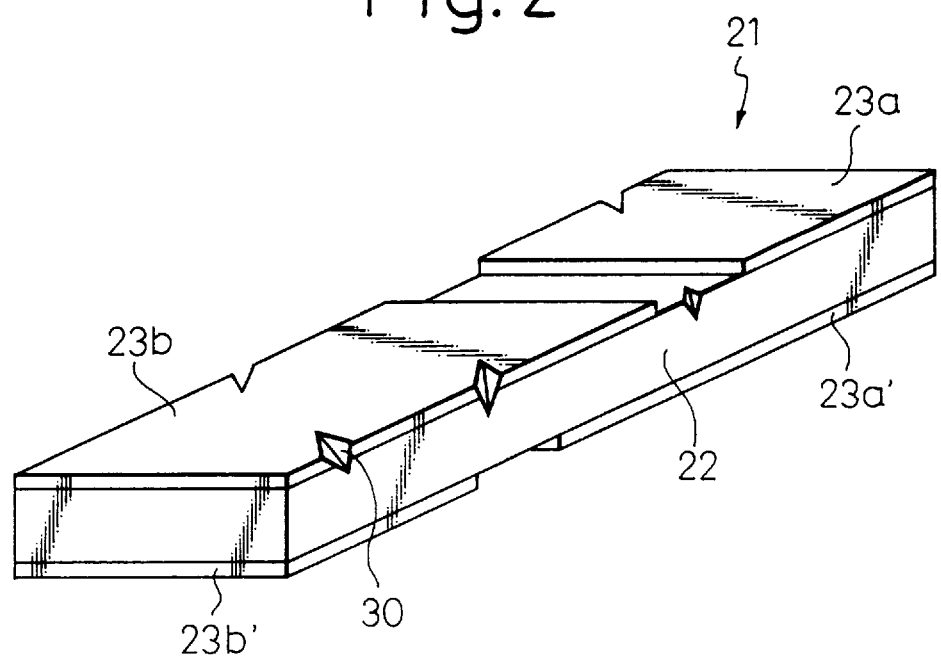
FIG. 2 is a perspective view for showing a state where micro-cracks are generated on a vibrating element.
Figure 3:
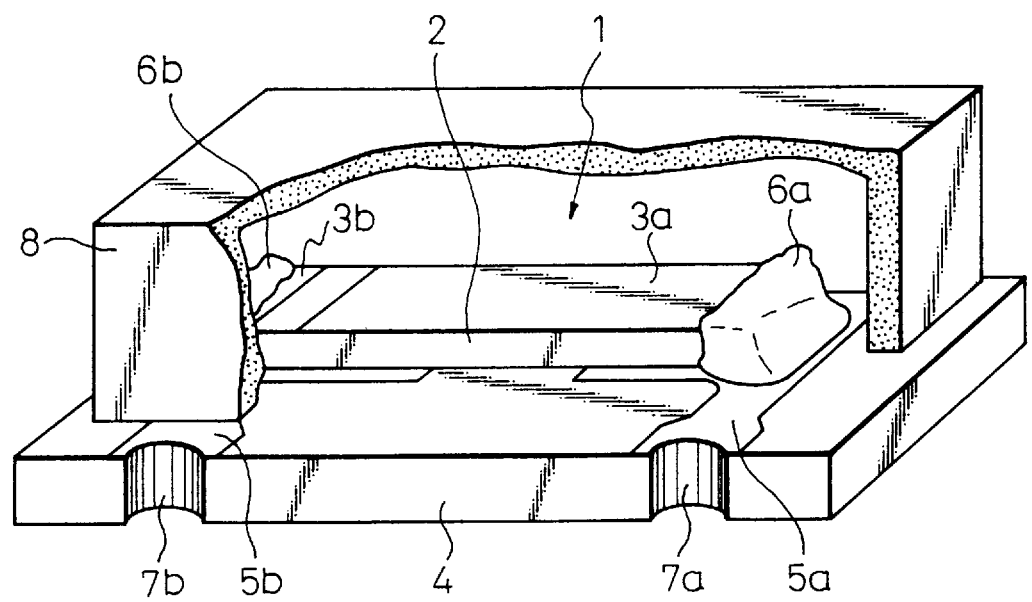
FIG. 3 is a partially cutaway view in perspective of the basic structure of a piezoelectric device embodying the present invention.

FIG. 3 is a schematic illustration exemplifying the essential structure of a piezoelectric device embodying the present invention.

In the figure, a reference numeral 1 denotes a strip-shaped vibrating element, which has a structure in which a pair of driving electrodes 3a and 3b are formed on the main opposing surfaces (shown as upper and lower surfaces in the figure) of a piezoelectric substrate 2 which is prepared by slicing it out of a single crystal of lithium niobate ($LiNbO_3$) or lithium tantalate ($LiTaO_3$). A reference numeral 4 represents an insulating substrate which is used for mounting the vibrating element 1 thereon and is made of ceramic or the like. Reference numerals 5a and 5b indicate terminal electrodes which are respectively arranged on the insulating substrate 4 and are electrically connected with corresponding driving electrodes 3a, 3b by using conductive adhesive 6a, 6b such as sliver paste. This conductive adhesive 6a, 6b also has the function of fixing the vibrating element 1 on the insulating substrate 4.

Terminal electrodes 5a, 5b formed on the insulating substrate 4 are conductively led to the opposite side of the insulating substrate 4, respectively via through-holes 7a, 7b, so that driving signals for exiting the piezoelectric device can be applied to the driving electrodes 3a, 3b from an external power supply, via through-holes 7a, 7b, terminal electrodes 5a, 5b and then, conductive adhesive 6a, 6b. Reference numeral 8 designates a cap made of ceramic or the like for use in protecting the piezoelectric device.

To the piezoelectric device having the essential structure as described above, in each of preferred embodiments according to the present invention, a surface active agent or surfactant (a part designated by a reference numeral 10 in FIG. 5 or a part indicated by a reference numeral 11 in FIG. 6) is applied, as described later, to at least the longitudinal side portions of the vibrating element 1.

Figure 4:
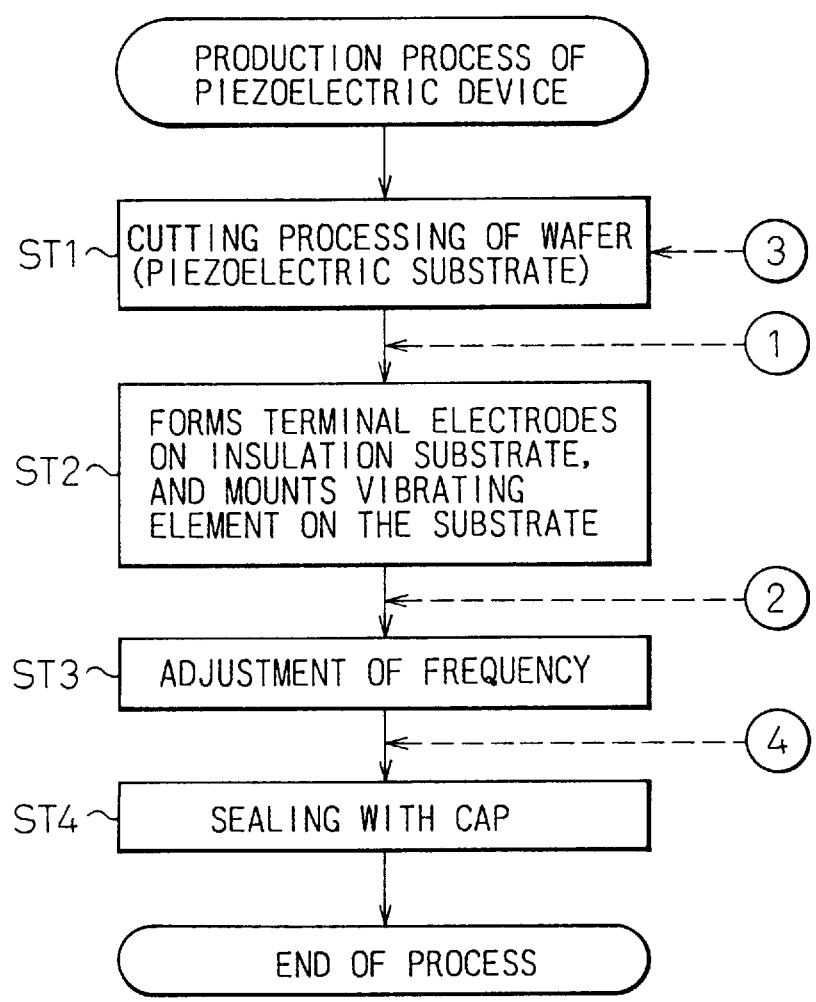
FIG. 4 is a flow chart showing the outline of general steps for producing a piezoelectric device.

A method of producing a piezoelectric device in each of preferred embodiments according to the present invention will now be explained in the following, with reference to a flow chart as shown in FIG. 4.

GENERAL PROCESS OF PRODUCING PIEZOELECTRIC DEVICE

Referring first to a step ST1, a single crystal wafer of $LiNbO_3$ or $LiTaO_3$, i.e., a piezoelectric substrate (driving electrodes are prepared in advance on its main opposing surfaces) is immersed in a cutting solution (e.g. water) and is cut in the cutting solution and divided into individual vibration elements for use in the piezoelectric device (Individualization of Elements). In this case, each vibrating element is divided so as to have such a strip-like shape as shown in FIG. 3.

In the next step ST2, terminal electrodes to receive driving signals are formed at predetermined positions on an insulating substrate, and then, the strip-shaped vibrating element, having driving electrodes as formed in advance, is mounted on the insulating substrate. At this stage, the driving electrodes of the vibrating element are electrically connected with the terminal electrodes provided on the insulating substrate by using a conductive adhesive such as sliver paste or the like. With this step, a piezoelectric device (resonator device) is substantially realized.

In the next step ST3, the adjustment of the resonator frequency is performed by way of removing (trimming) a part of the driving electrodes of the vibrating elements with a laser beam or the equivalent. It should be noted, however, that this step ST3 is to be executed only in the case $LiTaO_3$ is used for forming the piezoelectric substrate, but is not required in case of using $LiNbO_3$ for the same (namely, it is allowed to jump directly to the next step, ST4, from step ST2).

In the final step ST4, in order to protect the piezoelectric device as formed in the step ST3 (or step ST2) from the ambient atmosphere, the device is capped with a ceramic cap to hermetically seal the device. Through the above steps, a product (a piezoelectric device), as shown in FIG. 3, is completed.

First Preferred Embodiment

In this first embodiment, at the stage indicated with a circled numeral ①  in the flow chart shown in FIG. 4, in other words, at the stage before the strip-shaped vibrating element 1, which is cut out of the piezoelectric substrate through cutting, is mounted on the insulating substrate 4, the vibrating element 1 itself is sprayed with or dipped into a surface active agent or surfactant and coated therewith.

Figure 5:
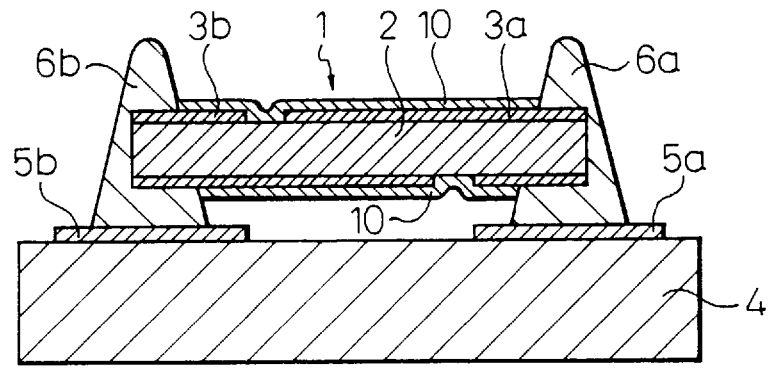
FIG. 5 is an illustration for use in explanation of a producing method according to the first embodiment of the present invention.

In FIG. 5, there is shown a cross sectional view of the structure of the piezoelectric device which is manufactured according to the production method of the first embodiment. However, the figure does not show a cap for protecting the device. In FIG. 5, the part designated by the reference numeral 10 corresponds to a film of a surface active agent or surfactant.

As the surface active agent or surfactant, a macromolecular material (for instance, an antistatic agent or antistat expressed by the following structural formula) is used.

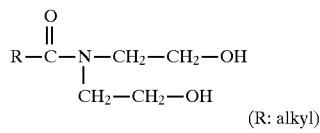

(R: alkyl)

The properties of the material are as follows:

Insulating resistance; higher than 1 [MΩ] . . . This value has been determined in view of the test standard.

Molecular weight; 50 to 300 . . . These values have been found suitable based on experiments performed on several materials. In this connection, the antistatic agent or antistat as described above has a molecular weight of 132.

Film thickness; 0.1 to 10 [μm] . . . Through the experiments, it has been found that the effect of suppression of fluctuation in resonant resistance is not enough if the film has a thickness of less than the above lowest value, and that characteristics which the piezoelectric device has to have are deteriorated if the film has a thickness of more than the above highest value.

According to the first embodiment, owing to the film 10 of the surface active agent or surfactant as formed to surround the vibrating element 1, generation of undesired vibration which is caused by micro-cracks is suppressed, thereby effectively suppressing fluctuations in the resonant resistance depending on variation of the excitation level, i.e., fluctuations in the loss level. Especially, in the case of the device operation at a low voltage, oscillation failure, fluctuation in oscillation frequency and so forth may occur, but such problems can be successfully obviated by the use of the surface active agent or surfactant film 10.

Further, since the vibrating element 1 itself is independently coated with the surface active agent or surfactant before it is mounted on the insulating substrate 4, the surface active agent or surfactant is not transferred to the surface of the insulating substrate 4. Therefore, in the final stage of the producing where the device is capped with a cap 8 for sealing thereof, no gas is generated by a chemical reaction between the adhesive for sealing the device and the surface active agent or surfactant, and no bubbles caused by the gas are generated, so that the invention provides such an advantage that possibility of adversely affecting the sealed device can be ignored.

Second Preferred Embodiment

In the second embodiment, at the stage indicated with the circled numeral ② in the flow chart shown in FIG. 4, namely at the stage after the strip-shaped vibrating element 1 is mounted on the insulating substrate 4 and the piezoelectric device has been substantially completed, all the insulating substrate 4, including the vibrating element 1, is sprayed with or dipped into the surface active agent or surfactant and coated therewith.

Figure 6:
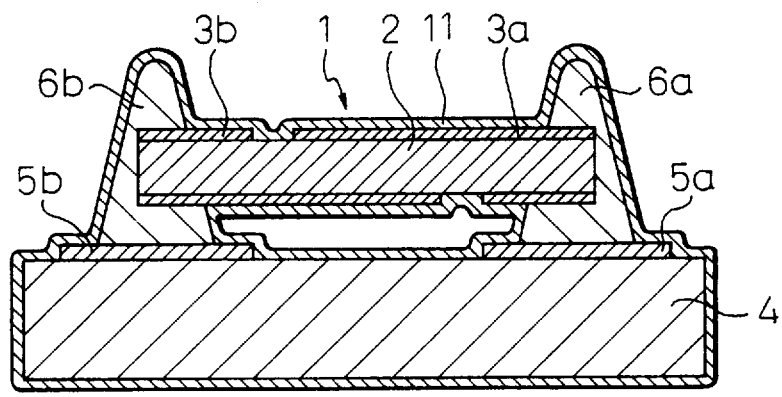
FIG. 6 is an illustration for use in explanation of a producing method according to the second embodiment of the present invention.

In FIG. 6, a cross section of the piezoelectric device, which is produced based on the producing method according to the first embodiment, is shown. However, the figure does not show a cap for protecting the device. In FIG. 6, the part designated by the reference numeral 11 corresponds to a film formed of a surface active agent or surfactant.

The properties of the surface active agent or surfactant used here are the same as those in the first embodiment.

According to this second embodiment, since the film 11 of the surface active agent or surfactant is formed all over the insulating substrate 4, including the vibrating element 1, the generation of undesired vibration caused by micro-cracks or the like is suppressed in the same way as in the first embodiment, thereby effectively suppressing fluctuations in the resonant resistance due to variations in the excitation level, i.e., fluctuations in the loss level.

Third Preferred Embodiment

In this third embodiment, at the stage as indicated with a circled numeral ③ of the flow chart as shown in FIG. 4, namely at the stage where the wafer (piezoelectric substrate) is divided by cutting to form the strip-shaped vibrating element 1, the surface active agent or surfactant is mixed with the cutting solution, so that the vibrating element can be cut and coated with the surface active or surfactant at the same time.

The cross sectional structure of the piezoelectric device based on the production method according to the third embodiment is the same as that in the case of the first embodiment, as shown in FIG. 5.

Besides, the properties of the surface active agent or surfactant as used in this embodiment are the same as those in the first embodiment.

According to the third embodiment, in the same way as in the case of the first embodiment, owing to the film of the surface active agent or surfactant formed on the vibrating element 1, generation of undesired vibrations which are caused by micro-cracks etc. is suppressed, thereby suppressing fluctuations in the resonant resistance due to a change in the excitation level, i.e., a fluctuation in the loss level.

Further, since the vibrating element itself is simultaneously coated with the surface active agent or surfactant while it is being individually cut out of the wafer (piezoelectric substrate), the effect as expected can be obtained with the same number of producing steps as that in the general producing process as shown in FIG. 4, in other words, without including the additional step indicated by the circled numeral 1 in the first embodiment.

Fourth Preferred Embodiment

In the fourth embodiment, at the stage indicated by the circled numeral ④ on the flow chart shown in FIG. 4, namely at the stage after the frequency of the piezoelectric device has been adjusted through a trimming process using a laser beam or the like, all of the insulating substrate 4, including the vibrating element 1, is coated with the surface active agent or surfactant by way of spraying or dipping.

In this case, due to the coating of the surface active agent or surfactant, the frequency of the piezoelectric device shifts to the lower side to some extent, so that it is necessary for the frequency to be set a little higher at the time of carrying out the adjustment thereof using the trimming treatment.

The cross sectional structure of the piezoelectric device based on the production method according to the fourth embodiment is the same as in the case of the second embodiment, as shown in FIG. 6.

Besides, the properties of the surface active agent or surfactant as used in this embodiment are the same as those in the first embodiment.

According to this fourth embodiment, in the same way as in the case of the second embodiment, the film of the surface active agent or surfactant is formed to surround all of the insulating substrate 4 including the vibrating element 1, so that the generation of undesirable vibrations which is caused by micro-cracks is suppressed, thus suppressing fluctuations in the resonant resistance due to variations in the excitation level, i.e., fluctuations in the loss level.

The piezoelectric device manufactured by the production method according to each of the first through the fourth embodiments as described above, is selected by the following test for determining whether the device is to be accepted or rejected, before shipping.

Exemplary Method of Testing

① Driving the piezoelectric device is tested at excitation levels, varying by 5 dBm, within the level range from −40 dBm to 0 dBm (namely, −40 dBm, −35 dBm, −30 dBm, . . . −5 dBm, 0 dBm), and measuring the resonant resistance (loss level) of the device at the respective driving levels above;

② Computing a difference between the maximum and minimum values as measured in the above i.e., a maximum quantity (ΔRs) of fluctuation in loss level; and ③ Judging whether or not the computed maximum fluctuation quantity (ΔRs) in loss level is within 1 dBm and determining whether to accept or reject the device based on said judgement.

Figure 7:
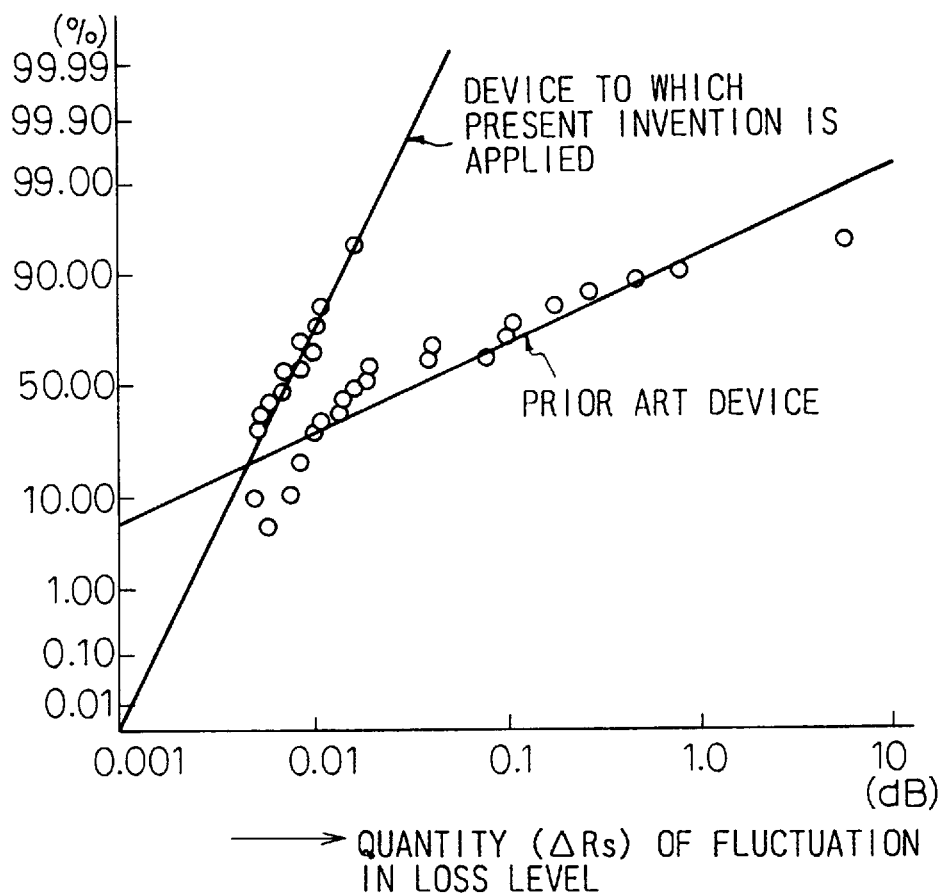
FIG. 7 is a graphical presentation for showing the characteristics of the piezoelectric device manufactured according to the present invention, to be compared with that of the prior art device.

FIG. 7 is a graphical presentation showing the characteristics of the piezoelectric device manufactured by production methods according to each of embodiments of the present invention, as compared with the prior art device.

The characteristic curves as shown in the figure indicate a normal distribution of the quantity (ΔRs) of the fluctuations in resonant resistance (loss level) depending on the excitation level of the piezoelectric device. It will be understood from comparison with the prior art device, that the quantity ΔRs of the fluctuations in the loss levels in the device according to the invention is well suppressed so as to make it smaller (namely, to provide a more stable operation) over a wider range.

Although, in the above, the production method according to the present invention has been described by taking four preferred embodiments, it should be noted that preferable embodiments of the present invention should not be limited to these four embodiments only. For instance, although the embodiments in the above have been described by taking an exemplary case where the antistatic agent or antistat is used as the surface active agent or surfactant, it should be apparent to those skilled in the art that the surface active agent or surfactant should not be limited to that which has been described in the above, as long as it can mechanically suppress the vibration caused by micro-cracks generated at the edge portions of the vibrating element.

What is claimed is:

1. A resonator device comprising:

an insulating substrate, a strip-shaped vibrating element which is mounted on said insulating substrate and is provided with electrodes formed on the main opposing surfaces of a piezoelectric substrate, and terminal electrodes which are provided on said insulating substrate so as to be electrically connected with said driving electrodes and to which driving signals are applied by an external signal source, wherein at least longitudinal side portions of said vibrating element are coated with a surface active agent, said surface active agent consisting of a macromolecular material having the structural formula:

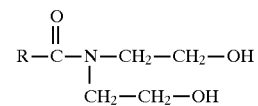

where R is alkyl, and having a molecular weight of 50 to 300.

2. The resonator device as claimed in claim 1, wherein said piezoelectric substrate is prepared by slicing a single crystal of lithium niobate or lithium tantalate.

3. The resonator device as claimed in claim 1, wherein said surface active agent consists of a macromolecular material having an insulating resistance of 1 MΩ.

4. The resonator device as claimed in claim 1, wherein a film formed by coating said surface active agent has a thickness of 0.1 μm to 10 μm.

5. The resonator device as claimed in claim 1, wherein said resonator device is a device which performs a series resonance.

* * * * *